United States Patent [19]
Becker

[11] Patent Number: 5,861,630
[45] Date of Patent: Jan. 19, 1999

[54] METHOD FOR GENERATING A BORON VAPOR

[76] Inventor: Richard L. Becker, 39 Topsfield Rd., Ipswich, Mass. 01938

[21] Appl. No.: 968,808

[22] Filed: Nov. 22, 1997

[51] Int. Cl.$^6$ .................................................. H01J 37/08
[52] U.S. Cl. ...................................... 250/423 R; 250/424
[58] Field of Search ................................ 250/423 R, 424, 250/425, 426, 492.21

[56] References Cited

U.S. PATENT DOCUMENTS 5,315,121  5/1994  Kluge et al. ...................... 250/423 R

OTHER PUBLICATIONS

Handbook of high Temperature Compounds pgs. 175–177. No Date.

*Primary Examiner*—Kiet T. Nguyen
*Attorney, Agent, or Firm*—Don Halgren

[57] ABSTRACT

The present invention relates to a method of generating substantially pure boron ions for use as a plasma-process feed gas. An electrode substance material in the chamber is comprised of a mixture of boron atoms and metal atoms. The substance or compound is thermally decomposable within a suitable temperature range, to provide boron vapor and other species which are substantially not in the vapor state. A heating of the substance material induces the controlled thermal decomposition of the boron compound in a stoichiometrically favorable manner. Magnetic confinement of the simultaneously released electrons causes numerous collisions, resulting in ionization of the vapor, to the plasma state. This plasma may then be extracted and accelerated at a suitable energy toward a workpiece.

24 Claims, 2 Drawing Sheets

METHOD FOR GENERATING A BORON VAPOR

BACKGROUND OF THE INVENTION

1. Field of the Invention

This invention relates to a method of generating a semi-pure boron vapor by the temperature-controlled decomposition of a metal boride chosen from those specific materials including yttrium, and the rare earths gadolinium through lutetium (atomic numbers 64 through 71), such as would be useful in the production of a feed gas to create ions and ion-clusters for a variety of applications, the ions and clusters being useful in the manufacture of semiconductors, flat panel displays, metallurgical surface modification, or for the formation of surface layers of boron-containing compounds. The preferable metal-borides have ratios of six and higher (Boride-to-metal-ratio), and have been identified as uniquely producing boron vapor preferentially to releasing their metal components, yielding a vapor with extremely high boron-to-metal ratios.

2. Prior Art

Boron is an atomic species commonly used in the fields of ion implantation and plasma processing, for the doping of semiconductors, flat panel displays and for surface property modification in metallurgical and ceramic applications. For any of these applications, the method of producing boron ions begins with a boron-containing feed gas introduced into an ion or plasma source. Ions are then created in a magnetically confined space, extracted by voltage potential differential, and accelerated toward the workpiece at a suitable energy. A magnetic mass filter may be then utilized to select a desired species of ion, and the resultant beam of ions is made to impinge on, and be embedded onto or within the near surface region of a semiconductor wafer or other workpiece. While a variety of atomic species are currently in regular usage by this process, boron has always been relatively difficult to produce with as large an ion flux as other common species, such as phosphorus, arsenic, antimony or nitrogen. The low ion flux is significant because of the high cost of ownership of such equipment. Therefore, increasing throughput and yield is a major concern in this industry.

A cause of the low ion flux is the limitation of known feedstock materials to create the necessary ionizable gas. The element boron is highly refractory and does not readily vaporize at temperatures below 2000° C. Therefore, a gaseous compound of boron, boron tri-fluoride ($BF_3$) is conventionally utilized as the precursor material. Since this $BF_3$ gas contains only 25 atomic percent boron, the resulting boron ion beam is proportionally diminished, and it consists of a mixture of species, such as B+, F+, BF+, and $BF_2$+, of which the desired boron ions are a minority. In addition, all of the boron halides, including $BF_3$, are extremely toxic and corrosive, requiring special monitoring and gas handling equipment, as well as substantially increased maintenance expenses.

A variety of methods and materials have been employed to produce a more boron-rich feed gas. Other feed gas candidates have included various boron halides, boranes (boron-hydrogen compounds), and lanthanum hexaboride ($LaB_6$). For $LaB_6$, see U.S. Pat. No. 5,162,699, Tokoro et al, incorporated herein by reference. In all cases there have been undesirable characteristics of the compound that either reduce its efficiency for producing a boron ion flux or limit the lifetime for evolution of boron vapor. For example, the other boron halides are no better than $BF_3$ for producing boron flux for the same reason; i.e. the boron beam is a small percentage of the initially evolved species. The boranes are either unstable and gradually decompose to elemental boron in their storage containers, or tend to be difficult to vaporize.

At elevated temperatures (on the order of 1800°–2300° K), $LaB_6$ emits boron and lanthanum vapor for moderate time periods, on the order of a few hours, before its output diminishes significantly. At temperatures (on the order of 1800° to 2300° K), $LaB_6$ decomposes primarily by emission of lanthanum atoms. See *Handbook of High Temperature Compounds*, p. 175–176, incorporated herein by reference. At sufficiently higher temperatures, typically found when $LaB_6$ is in direct electrical and thermal contact with a heated electron-emitting filament, the residual boron can be made to evaporate because the vapor pressure of elemental boron is reached. The sputtering action caused by ion bombardment in an ion source can also produce some boron vapor from $LaB_6$ when it is in electrical contact with a filament cathode. However, there are several deficiencies in producing boron vapor using $LaB_6$. The preferential loss of lanthanum vapor from the surface results in the formation of an insulating boron-rich layer that cannot be readily vaporized except where the $LaB_6$ is the hottest. The effect of this is to "seal in" most of the remaining $LaB_6$, severely decreasing boron vapor output, and resulting in an undesirably short operating lifetime. In addition, the boron-rich interface between the $LaB_6$ and the filament, which is typically fabricated from tungsten, causes the filament to be converted to tungsten boride, rather than boron vapor, thereby "poisoning" the filament. Thus, the use of $LaB_6$ as a boron vapor source is limited by the preferential emission of lanthanum, the chemical reaction with the tungsten filament, the gradual conversion to hard-to-vaporize elemental boron, and the very high temperature required to produce any boron vapor at all. This combination of factors results in an unreasonably limited lifetime for boron vapor production.

Boron vapors may also be usefully ion implanted into metals and ceramics for hardening of a surface layer. This treatment may be of value for cutting edges, jewelry, optics and tooling. The complexity of conventional ion implantation equipment with costly mass analysis and scanning systems prevents this treatment from being economically applied to low cost workpieces. A more cost-effective, non-mass-analyzed method of generating boron ions would be advantageous.

BRIEF SUMMARY OF THE INVENTION

The present invention relates to a method and apparatus for generating substantially pure boron vapor for use as a plasma-process feed gas. Plasma is defined as an ionized gas containing positively charged ions and negatively charged electrons, having its own unique properties. An electrode substance material in a plasma generating chamber in the apparatus is comprised of boron atoms and metal atoms. The substance material or compound is thermally decomposable within a suitable temperature range, to provide boron vapor and other species which are substantially not in the vapor state. A method of heating the substance material induces the controlled thermal decomposition of the boron compound in a stoichiometrically favorable manner. Magnetic confinement of the simultaneously released electrons causes numerous collisions, resulting in ionization of the vapor, to the plasma state. Boron ions in this plasma may then be extracted and accelerated at a suitable energy toward the workpiece, or deposited by use of a biased substrate immersed in the plasma.

Certain metal boride compounds exist which have a variety of boron-to-metal ratios: $M_xB_y$ where y/x>1. When the boron-to-metal ratio of these borides is six or greater, the final decomposition end product tends to be a boride with a ratio of four. When heated sufficiently in an ion source arc chamber, the decomposition of these borides with a ratio greater than four, results in the generation of boron vapor. Because the companion metal in the compound does not vaporize as readily as the boron, the metal tends to remain present in the remaining boron-boride mixture. This predominantly produces boron vapor, which may then be ionized to form a relatively pure boron plasma.

Such metal borides, comprised only of yttrium and the lanthanide rare-earth's gadolinium through lutetium (atomic numbers 64 through 71), do not readily vaporize the metal component together with the boron. Since higher boron-to-metal ratio borides decompose prior to melting, there exists in each case, a lower ratio boride that decomposes at a higher temperature, indicating that there will be a successive loss of boron as a vapor, with the next lower ratio boride as the decomposition product, until $MB_4$ is reached. As may be seen in its phase diagram, $YB_4$ does not decompose in the solid state, and is the most refractory of the several yttrium borides. Thus, it is the end product of the chain of decomposition. Furthermore, the borides of yttrium, gadolinium, terbium, holmium, erbium, thulium, lutetium, dysprosium and ytterbium decompose to only pure boron vapor over a particular temperature range. It is only the hexaborides and higher ratios of these compounds which decompose in this manner at high temperature, typically fractionating into molecular units (i.e. icosahedra) of 12 boron atoms or multiples thereof, which is a natural and stable formation.

The vapor pressures of various metal borides are given only at 1823° Kelvin (1550° C.), in the table taken from *The Handbook of High Temperature Compounds* (Kosalapova, 1990), incorporated herein by reference. When converted into millitorr units, the various metal boride values are: $YB_6$(4.6 mTorr), $GdB_6$(6.2 mTorr), $TbB_6$ (6.8 mTorr), $HoB_6$ (67.9 mTorr), $ErB_6$ (41.2 mTorr), $TmB_6$ (336 mTorr), and $LuB_6$ (3.7 mTorr). These values are quite temperature sensitive, typically increasing exponentially with greater temperature. These vapor pressure values are in the range suitable for use with conventional ion sources and other plasma process sources as currently utilized in manufacturing and semiconductor processes. This temperature of only 1550° C. is far lower than for the temperature of a filament in such a source when emitting electrons at about 2300° C. In practice, the metal boride could be placed in proximity to such a filament or electron-beam source.

The borides that have greater boron-to-metal ratios (i.e. 6, 12, 66, 70 etc.) thus provide the greatest amount of boron vapor before the decomposition is halted at the tetraboride state. Thus, it is preferable to use feedstock material that is as enriched as possible in the higher boron ratios, and which has as little as possible of the lower boron ratios, which are typically diboride and tetraboride. Additionally, the decomposition of the higher borides, such as $YB_{66}$, may proceed by the emission of clusters of boron atoms. Such clusters are particularly valuable as a source of low energy boron atoms when an ion beam of such clusters is accelerated. Each of the atoms in the cluster of N atoms possess only 1/N of the total energy of the accelerated ion cluster. Thus, if an icosahedral cluster of $B_{12}$ is emitted and accelerated to 1.2 keV, the average energy of each of the boron atoms when it impacts on a surface, is close to 100 eV. The intensity of an accelerated ion beam is typically greater for higher voltage accelerations, so it is desirable to use a cluster to lower the resultant atom energy, if possible. The decomposition of the boride feedstock is most easily effected by heating. While numerous well-known techniques exist for heating, the selected method will depend on the application and on spatial constraints. For example, if a boron vapor is to be used in an ion source, the plasma discharge may be self-sustaining, obviating the need for a support gas, and make possible high purity boron plasma. The boride may be raised to a suitable negative voltage, and positively charged boron ions in the plasma will then bombard the feedstock with significant energy. The temperature will rise to a value enabling the controlled sublimation of the particular boride electrode, and boron vapor will be emitted along with copious quantities of ionizing electrons. The applied voltage may be then raised or lowered as required to maintain the desired rate of production of boron vapor. The applied voltage may be alternated between two or more electrodes to induce ionization from more than one point in the source. A temperature sensing device, such as a thermocouple or pyrometer, may be employed to assist in the control of the decomposition process, allowing a proper vapor pressure to be maintained.

In other embodiments, it may be preferable to utilize the boride feedstock either in, or as, a containment oven or chamber, which is temperature controlled. An orifice may be placed within the wall of that oven in order to direct the flow of boron vapor to a useful location. Radiant heating, RF heating, plasma and/or electron bombardment, or laser heating means, may be directed so as to heat the boride feedstock within the chamber, and be conveniently employed according to the needs and limitations of the embodiment. Metal borides generally have a very low electron emission work function, and will therefore readily emit electrons at temperatures of the order of 1500° C. This property may be utilized to turn the boride into one or more cathodes within a plasma source. The simultaneous emission of boron vapor and electrons when magnetically confined within the plasma generating chamber within the apparatus, produces boron ions and/or clusters, which may then be extracted from the chamber and accelerated to the workpiece.

This method of preparing boron ions using a boride feedstock which preferentially emits boron rather than metal vapor is suitable for use with ion sources that do not have the resultant ions mass-analyzed. Because the ion flux from such a source is relatively pure in boron ions, most non-semiconductor applications could employ such a boron ion source. These ion sources are commonly required for ion implantation of metallurgical workpieces, such as cutting edges, machine tools or jewelry.

The present invention thus comprises a method of generating boron ions in a boron ion source apparatus, comprising the steps of: arranging a plasma generating chamber having an electrode arrangement in said source apparatus, for the generation of boron ions; fabricating a component of the plasma generating chamber from a boron compound which boron compound decomposes primarily by the emission of boron vapor; introducing a carrier gas into the plasma generating chamber; heating the electrode arrangement in the plasma generating chamber by ionizing the carrier gas therein, to induce the electrode arrangement to emit boron vapor; ionizing the boron vapor to create a boron ion plasma within the plasma generating chamber; accelerating the boron plasma towards a workpiece by activation of an electrical potential differential in the chamber. The method includes the steps of: selecting the boron compound from a boride of the elements comprised of: yttrium, gadolinium, terbium, dysprosium, holmium, erbium, thulium, lutetium and ytterbium; selecting the boride so as to have a boron-to-metal atom ratio which is greater than 4:1; selecting the carrier gas from the group consisting of nitrogen, oxygen, fluorine, chlorine, neon, argon, krypton and xenon, or selecting the carrier gas from the group consisting of boron-containing gas compounds. The method includes the step of: heating the electrode arrangement in the plasma generating chamber by a voltage extending between an anode and an electron-emitting cathode in the apparatus, or heating the electrode arrangement in the plasma generating chamber by means of a high frequency electromagnetic radiation wave being released in the chamber from an electromagnetic energy source arranged within the apparatus, or heating the electrode arrangement in the plasma generating chamber by a spark trigger between an anode and an electron-emitting cathode in the apparatus, or heating the boron compound by means of a bombardment of charged particles from the plasma, or heating the boron compound by means of an electrical resistance heater in the apparatus, or heating the boron compound by means of an electromagnetic radiation generator in the apparatus. The method includes the step of heating the boron compound to a temperature range of between about 1000° C. to about 2500° C.

The invention also includes a method of generating boron cluster ions in a boron cluster ion source apparatus, comprising the steps of: arranging a plasma generating chamber having an electrode arrangement in the source apparatus, for the generation of boron cluster ions; fabricating a component of the plasma generating chamber from a boron compound which boron compound decomposes primarily by the emission of boron cluster vapor and boron atom vapor; introducing a carrier gas into the plasma generating chamber; heating the electrode arrangement in the plasma generating chamber by ionizing the carrier gas therein, to induce the electrode arrangement to emit boron cluster vapor; ionizing the boron cluster vapor to create a boron cluster ion plasma within the plasma generating chamber; and accelerating the boron cluster ion plasma towards a workpiece by activation of an electrical potential differential in the chamber. The method includes the steps of: selecting the boron compound from a boride of the elements comprised of yttrium, gadolinium, terbium, dysprosium, holmium, erbium, thulium, lutetium and ytterbium, and selecting the boride so as to have a boron-to-metal atom ratio which is at least 12:1; selecting the carrier gas from the group consisting of: neon, argon, krypton, xenon, nitrogen, oxygen, fluorine and chlorine, or selecting the carrier gas from the group consisting of boron-containing gas compounds. The method includes the steps of: heating the electrode arrangement in the plasma generating chamber by a voltage extending between an anode and an electron-emitting cathode in the ion source chamber, or heating the electrode arrangement in the plasma generating chamber by means of a high frequency electromagnetic radiation wave being released in the ion source chamber from an electromagnetic energy source therewithin, or heating the electrode arrangement in the plasma generating chamber by a spark trigger between an anode and an electron-emitting cathode in the plasma generating chamber, or heating the boron cluster compound by means of a bombardment of charged particles from the plasma in the plasma generating chamber, heating the boron cluster compound by means of an electrical resistance heater in the plasma generating chamber, or heating the boron compound by means of an electromagnetic radiation generator in the plasma generating chamber, and heating the boron compound to a temperature range of between about 1000° C. and up to about 2500° C.

BRIEF DESCRIPTION OF THE DRAWING

The objects and advantages become more apparent when viewed in conjunction with the following drawings, in which;

FIG. 1b is a side elevational view, partly in section, of the plasma generating chamber in the ion source apparatus shown in FIG. 1a.

DESCRIPTION OF THE PREFERRED EMBODIMENTS

Figure 1A:
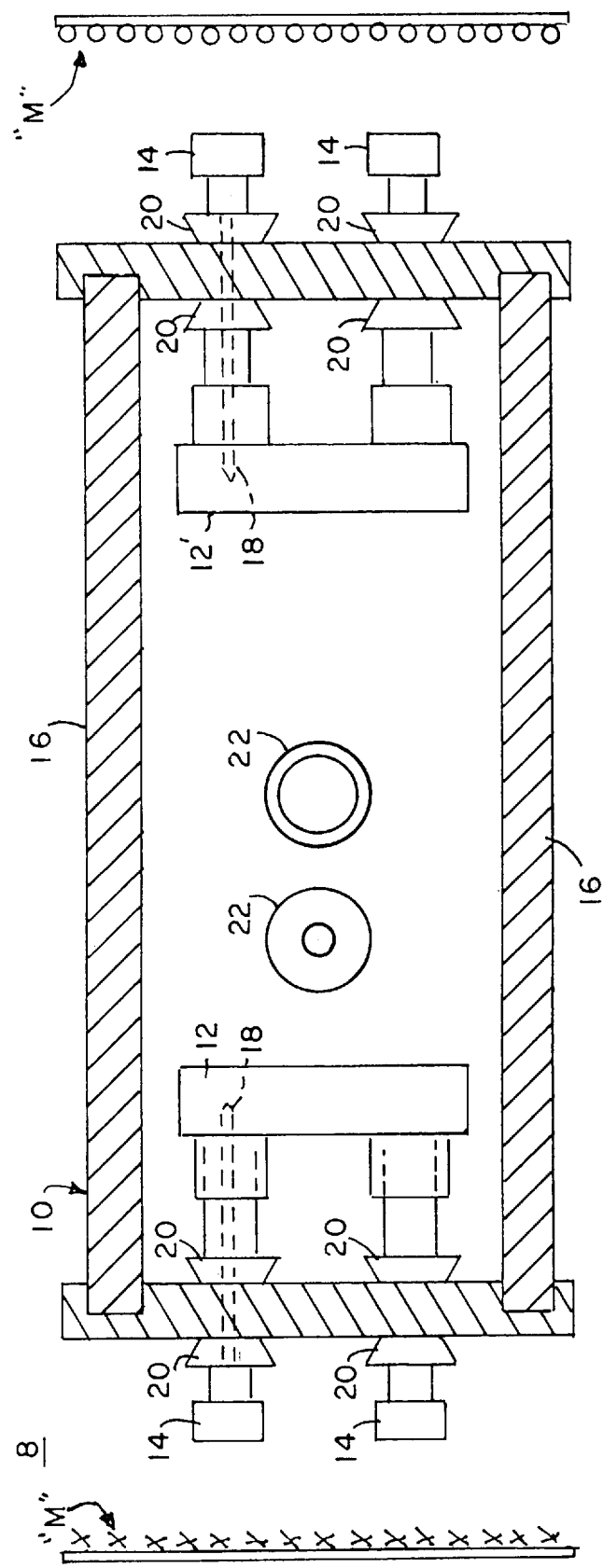
FIG. 1a is a plan view, partly in section, of an ion source apparatus with a plasma generating chamber arranged to provide a boron vapor.

The present invention relates to a source apparatus 8 for providing substantially pure boron vapor for use as a feed gas to a plasma generating chamber 10, such as shown in FIG. 1a, wherein an electrode 12 of preferred substance material, in the plasma chamber 10 is comprised of boron atoms and metal atoms. The substance material or boron compound is thermally decomposable within a suitable temperature range, identified hereinbelow, to provide boron vapor and other species which are substantially not in the vapor state. A heat source 14, such as a filament (which could also be fabricated from the source material), is arranged proximate to the electrodes 12 of the preferred substance material, to induce thermal decomposition of the boron compound electrodes 12, and to generate ionizing electrons.

The invention comprises the use as the substance material, a metal boride compound in which the companion metal is not so readily vaporized within the plasma generating chamber 10. Such a metal boride compound is utilized at a location in the chamber 10 that is sufficiently heated, and which results in the generation of boron vapor. In one embodiment of the present invention, the walls 16 of the chamber 10 itself, may also comprised of a boron compound.

Figure 1B:
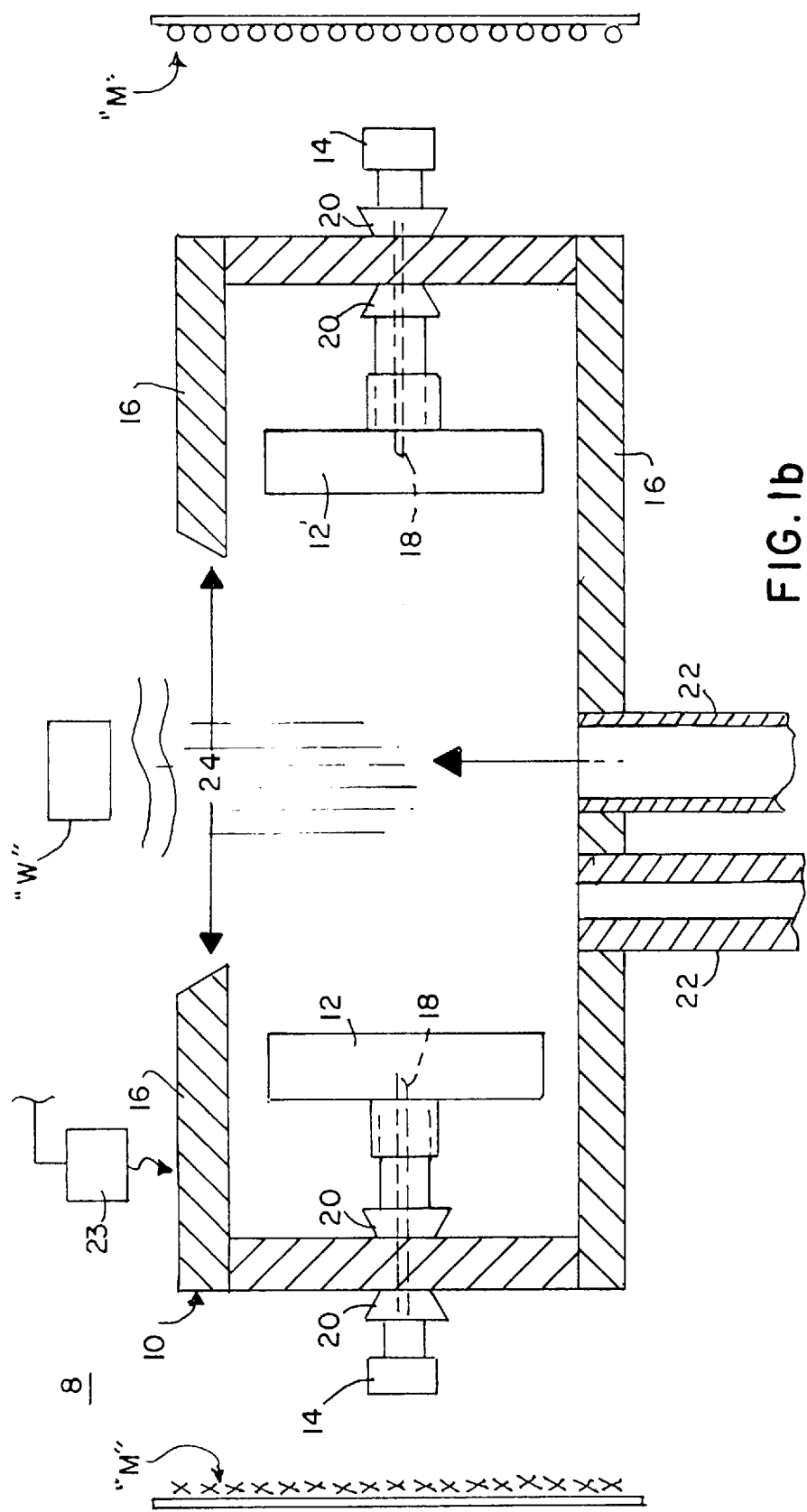

A temperature monitor 18, such as a high temperature thermocouple or an optical pyrometer may be arranged within or proximate to the substance material, as for example, boron compound electrodes 12 within the chamber 10. An insulator 20 is arranged to support a power input line or heat source 14 and a monitor device 18 for the electrodes 12. A magnetic field, designated as "M", acts as a magnetic plasma confinement for the plasma generated. A carrier gas feed line port 22, is arranged through an opening in the wall 16 of the plasma generating chamber 10, to direct a carrier gas into the plasma generating chamber 10, to initiate and/or sustain the discharge until the electrodes 12 reach a sufficient temperature to achieve and sustain release of boron vapor from the source material. A discharge aperture 24 is arranged through the wall 16, and is shown in FIG. 1b, to permit the extraction and acceleration of the ion plasma from the chamber 10.

Selecting the substance material for the electrodes is preferably done from certain metal borides, which have a variety of boron-to-metal ratios. When the boron-to-metal ratio of these borides is 6 or greater, the final decomposition end product tends to be a boride with a ratio of 4:1 [B:M]. Although the companion metal in the compound does not as readily vaporize, the metal may remain present, permitting a temperature-dependent gradual decomposition through successive borides, from a higher boron ratio towards the ratio of 4. Fractionating the source boride may also statistically produce congruent emission, as well as the emanation of clusters and superclusters, such clusters being defined as a fifth state of matter.

Such metal borides, comprised only of yttrium and the lanthanide rare earths gadolinium through lutetium (atomic numbers 64 through 71), do not readily vaporize their metal component together with the boron. Since higher boron-to-metal ratio borides decompose at or near melting temperature, there exists in each case, a lower ratio boride that decomposes at a higher temperature, indicating that there will be a successive loss of boron as a vapor, with the next lower ratio boride as the decomposition product, until $MB_4$ is reached. As may be seen in its phase diagram, $YB_4$ does not decompose in the solid state at temperatures found in typical ion sources, and is the most refractory of the $YB_x$ borides. Thus, it is the end product of the chain of decomposition and may be considered typical of the borides of yttrium, gadolinium, terbium, dysprosium, holmium, erbium, thulium, lutetium and ytterbium which decompose only to substantially pure boron vapor, instead of the metal and boron vapor, over a particular temperature range. It is only the hexaborides and those borides listed hereinabove, of these metals, which decompose in this manner.

In other embodiments, it may be preferable to utilize the boride feedstock either in, or as a containment oven, which has its temperature controlled. An orifice may be placed within the wall of that oven in order to direct the flow of boron vapor to a useful location. Radiant heating, RF heating, electron bombardment, or laser heating means may also be conveniently employed according to the needs and limitations of the embodiment, such being accomplished by a radiant heater, an RF generator, an electron beam generator or a laser device 23 arranged within the ion source 8 to effect heating of the boron source material electrodes 12. Metal borides generally have a very low electron emission work function, and will therefore readily emit electrons at temperatures of the order of 1500° C. This property make one or more cathode electrodes 12 within a plasma source from a metal boride, as shown in FIGS. 1*a* and 1*b*. The simultaneous emission of boron vapor and electrons when magnetically confined by the magnetic field "M", produces boron ions and/or clusters, which may then be extracted and accelerated to the workpiece "W" through the orifice 24, shown outside of the plasma generating chamber 10, in FIG. 1*b*.

By constructing the plasma generating device to suitably present the subject material to thermal decomposition temperatures as recited hereinabove, and combined with the simultaneous emission of copious quantities of magnetically confined electrons, a high degree of ionization of boron and boron clusters may be achieved, which may then be extracted, accelerated and made to impinge upon the workpiece.

Other alternative embodiments are suggested by the unique properties of these metal borides. The ability to generate electrons by thermionic emission indicates that the boron-producing element can also be a cathode within the chamber 10. Multiple cathodes of metal boride may also be employed. Another configuration, as shown in FIG. 1*b*, includes at least two electrodes 12 and 12', made from the metal boron in which the applied voltages alternate in such a manner that first one electrode 12 is the cathode and the second electrode 12' is the anode, then these voltages are reversed by a proper control circuit, not shown. Such alternating potentials may be chosen to match resonant frequencies of either the anodes or the icosahedra themselves. This configuration heats both metal boride electrodes 12 and 12' equally and can avoid loss of non-ionized boron vapor by allowing its re-deposition on the opposing electrode where it may again be re-emitted as vapor. Typical geometries for the electrodes 12 and 12' may, for example, be in the form of opposing plates, as shown in FIGS. 1*a* and 1*b*, or as coaxial cylinders or spheres of metal boride, not shown for simplicity of viewing.

Decomposition of the metal boride is most readily effected using thermal energy. However, several alternate embodiments of the decomposition process may be employed. Sputtering may be utilized at elevated temperatures to enhance the removal of boron atoms or clusters of boron atoms. Similarly, the oscillation period of the alternation of the applied voltage between at least two metal boride electrodes may be tuned to obtain a more efficient resonant decomposition frequency.

I claim:

1. A method of generating boron ions in a boron ion source apparatus, comprising the steps of:

arranging a plasma generating chamber having an electrode arrangement in said source apparatus, for the generation of boron ions;

fabricating a component of said plasma generating chamber from a boron compound which boron compound decomposes primarily by the emission of boron vapor;

introducing a carrier gas into said plasma generating chamber;

heating said electrode arrangement in said plasma generating chamber by ionizing said carrier gas therein, to induce said electrode arrangement to emit boron vapor;

ionizing said boron vapor to create a boron ion plasma within said plasma generating chamber;

accelerating said boron plasma towards a workpiece by activation of an electrical potential differential in said chamber.

2. The method of generating boron ions as recited in claim 1, including the step of:

selecting said boron compound from a boride of the elements comprised of: yttrium, gadolinium, terbium, dysprosium, holmium, erbium, thulium, lutetium and ytterbium.

3. The method of generating boron ions as recited in claim 2, including the step of:

selecting said boride so as to have a boron-to-metal atom ratio which is greater than 4:1.

4. The method of generating boron ions as recited in claim 1, including the step of:

selecting said carrier gas from the group consisting of nitrogen, oxygen, fluorine, chlorine, neon, argon, krypton and xenon.

5. The method of generating boron ions as recited in claim 1, including the step of:

selecting said carrier gas from the group consisting of boron-containing gas compounds.

6. The method of generating boron ions as recited in claim 1, including the step of:

heating said electrode arrangement in said plasma generating chamber by a voltage extending between an anode and an electron-emitting cathode in said apparatus.

7. The method of generating boron ions as recited in claim 1, including the step of:

heating said electrode arrangement in said plasma generating chamber by means of a high frequency electromagnetic radiation wave being released in said chamber from an electromagnetic energy source arranged within said apparatus.

8. The method of generating boron ions as recited in claim 1, including the step of:

heating said electrode arrangement in said plasma generating chamber by a spark trigger between an anode and an electron-emitting cathode in said apparatus.

9. The method of generating boron ions as recited in claim 1, including the step of:

heating said boron compound by means of a bombardment of charged particles from said plasma.

10. The method of generating boron ions as recited in claim 1, including the step of:

heating said boron compound by means of an electrical resistance heater in said apparatus.

11. The method of generating boron ions as recited in claim 1, including the step of:

heating said boron compound by means of an electromagnetic radiation generator in said apparatus.

12. The method of generating boron ions as recited in claim 1, including the step of:

heating said boron compound to a temperature of between about 1400° C. and about 2500° C.

13. A method of generating boron cluster ions in a boron cluster ion source apparatus, comprising the steps of:

arranging a plasma generating chamber having an electrode arrangement in said source apparatus, for the generation of boron cluster ions;

fabricating a component of said plasma generating chamber from a boron compound which boron compound decomposes primarily by the emission of boron cluster vapor and a boron atom vapor;

introducing a carrier gas into said plasma generating chamber;

heating said electrode arrangement in said plasma generating chamber by ionizing said carrier gas therein, to induce said electrode arrangement to emit boron cluster vapor;

ionizing said boron cluster vapor to create a boron cluster ion plasma within said plasma generating chamber;

accelerating said boron cluster ion plasma towards a workpiece by activation of an electrical potential differential in said chamber.

14. The method of generating boron cluster ions, as recited in claim 13, including the step of:

selecting said boron compound from a boride of the elements comprised of yttrium, gadolinium, terbium, dysprosium, holmium, erbium, thulium, lutetium and ytterbium.

15. The method of generating boron cluster ions as recited in claim 13, including the step of:

selecting said boride so as to have a boron-to-metal element ratio which is at least 12:1.

16. The method of generating boron cluster ions as recited in claim 13, including the step of:

selecting said carrier gas from the group consisting of: neon, argon, krypton, xenon, nitrogen, oxygen, fluorine and chlorine.

17. The method of generating boron cluster ions as recited in claim 13, including the step of:

selecting said carrier gas from the group consisting of boron-containing gas compounds.

18. The method of generating boron cluster ions as recited in claim 13, including the step of:

heating said electrode arrangement in said plasma generating chamber by a voltage extending between an anode and an electron-emitting cathode in said ion source chamber.

19. The method of generating boron cluster ions as recited in claim 13, including the step of:

heating said electrode arrangement in said plasma generating chamber by means of a high frequency electromagnetic radiation wave being released in said ion source chamber from an electromagnetic energy source therewithin.

20. The method of generating boron cluster ions as recited in claim 13, including the step of:

heating said electrode arrangement in said plasma generating chamber by a spark trigger between an anode and an electron-emitting cathode in said plasma generating chamber.

21. The method of generating boron cluster ions as recited in claim 13, including the step of:

heating said boron cluster compound by means of a bombardment of charged particles from said plasma in said plasma generating chamber.

22. The method of generating boron cluster ions as recited in claim 13, including the step of:

heating said boron cluster compound by means of an electrical resistance heater in said plasma generating chamber.

23. The method of generating boron cluster ions as recited in claim 13, including the step of:

heating said boron compound by means of an electromagnetic radiation generator in said plasma generating chamber.

24. The method of generating boron cluster ions as recited in claim 13, including the step of:

heating said boron compound to a temperature of between about 1000° C. and about 2500° C.

* * * * *